United States Patent
Heneveld et al.

(10) Patent No.: US 6,654,653 B1
(45) Date of Patent: Nov. 25, 2003

(54) METHOD FOR DESIGNING A SUPPORT

(75) Inventors: Alan D. Heneveld, Brighton, MI (US); Christopher J. Gerou, Franklin, MI (US); Ronald B. Drangin, Northville, MI (US)

(73) Assignee: Ford Motor Company, Dearborn, MI (US)

(*) Notice: Subject to any disclaimer, the term of this patent is extended or adjusted under 35 U.S.C. 154(b) by 0 days.

(21) Appl. No.: 09/552,041

(22) Filed: Apr. 19, 2000

(51) Int. Cl.⁷ .............................................. G06F 19/00
(52) U.S. Cl. ........................................ 700/97; 206/102
(58) Field of Search .............................. 700/95, 97, 98, 700/182; 206/102, 122

(56) References Cited

U.S. PATENT DOCUMENTS

| | | | | |
|---|---|---|---|---|
| 5,418,728 A | * | 5/1995 | Yada | 700/97 |
| 5,510,995 A | * | 4/1996 | Oliver | 700/182 |
| 5,877,970 A | * | 3/1999 | Nesbit et al. | 703/1 |
| 6,162,190 A | * | 12/2000 | Kramer | 600/595 |
| 6,392,651 B1 | * | 5/2002 | Stradley | 345/473 |

* cited by examiner

*Primary Examiner*—Leo Picard
*Assistant Examiner*—Zoila Cabrera
(74) *Attorney, Agent, or Firm*—David B. Kelley

(57) ABSTRACT

A method for designing a support is disclosed wherein the method minimizes wasteful production of multiple support prototypes. The method includes the steps of: obtaining a computer generated sample of an article of manufacture; designing a computer generated model of a support effective to receive the sample of the article; and obtaining approval of the model of the support.

20 Claims, 1 Drawing Sheet

METHOD FOR DESIGNING A SUPPORT

FIELD OF INVENTION

The present invention relates to a method for designing a support which supports and/or packages one or more articles of manufacture. More specifically, the present invention relates to a method for designing a support wherein at least one computer generated model of the support is created and approval of the computer generated model is obtained prior to actually forming the support.

BACKGROUND OF THE INVENTION

The manufacture and/or processing of articles of manufacture (e.g., finished products, components of products and/or tools for creating products) often requires the transfer or movement of such articles from one place or area to another place or area. For example, and without limitation, a part or component which is to be assembled may have to be shipped and/or transported from a production facility to an assembly facility. During the assembling or other processing of such articles of manufuacture, it is desirable to have supports (e.g., packaging materials such as boxes or supporting members such as racks) which package, support and/or house these articles in a manner that allows one or several articles to be moved efficiently and easily. For example, and without limitation, it is desirable to have a rack which can support and transfer several of the aforementioned components safely, easily and efficiently from one assembly line to another.

According to a traditional method, supports have been created, formed and/or manufactured as follows. A first person (e.g., a packaging engineer) would design a support for one or more articles of manufacture. Then, a first prototype of the support would be created and/or formed. The first prototype would then be tested and the testing would be followed by approval or disapproval of the support by a second person (e.g., a manufacturing engineer, a materials handling engineer and/or a production or assembly worker). If the design for the support was disapproved, the first person would have to then start from the design stage again and a second prototype would have to be produced. This cycle would have to be repeated until an acceptable support was formed.

However, designing, forming and/or manufacturing supports according to the above described traditional method presents drawbacks. For example, and without limitation, the traditional method of designing is inefficient because the method often requires multiple prototypes to be produced before a suitable support is formed. The production of multiple prototypes requires excess time and expenditure to form and/or create such prototypes.

Therefore, there is a need for a process and/or method for producing supports which minimizes or eliminates the need for creating prototypes of such supports.

SUMMARY OF THE INVENTION

It is a first object of the present invention to provide a method for designing and/or forming supports which overcomes the previously delineated drawbacks of conventional methods of designing and/or forming supports.

It is a second object of the present invention to provide a method which uses computer generated models of supports to maximize the efficiency of manufacturing such supports.

According to a first aspect of the present invention a method for forming a support for transferring an article of manufacture is disclosed. The method includes the steps of: designing an electronic sample of an article of manufacture; designing an electronic model of the support; forming a computer file having the sample and the model, and the sample received by the model; and distributing the file for approval of the model.

According to a second aspect of the present invention a method for producing a support for transferring an article of manufacture is disclosed. The method includes the steps of: obtaining a computer generated sample of the article; designing a computer generated model of the support such that the computer generated model of the support will selectively receive the computer generated sample of the article; obtaining approval of the computer generated model of the support; and forming the support based on the model of the support.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1:
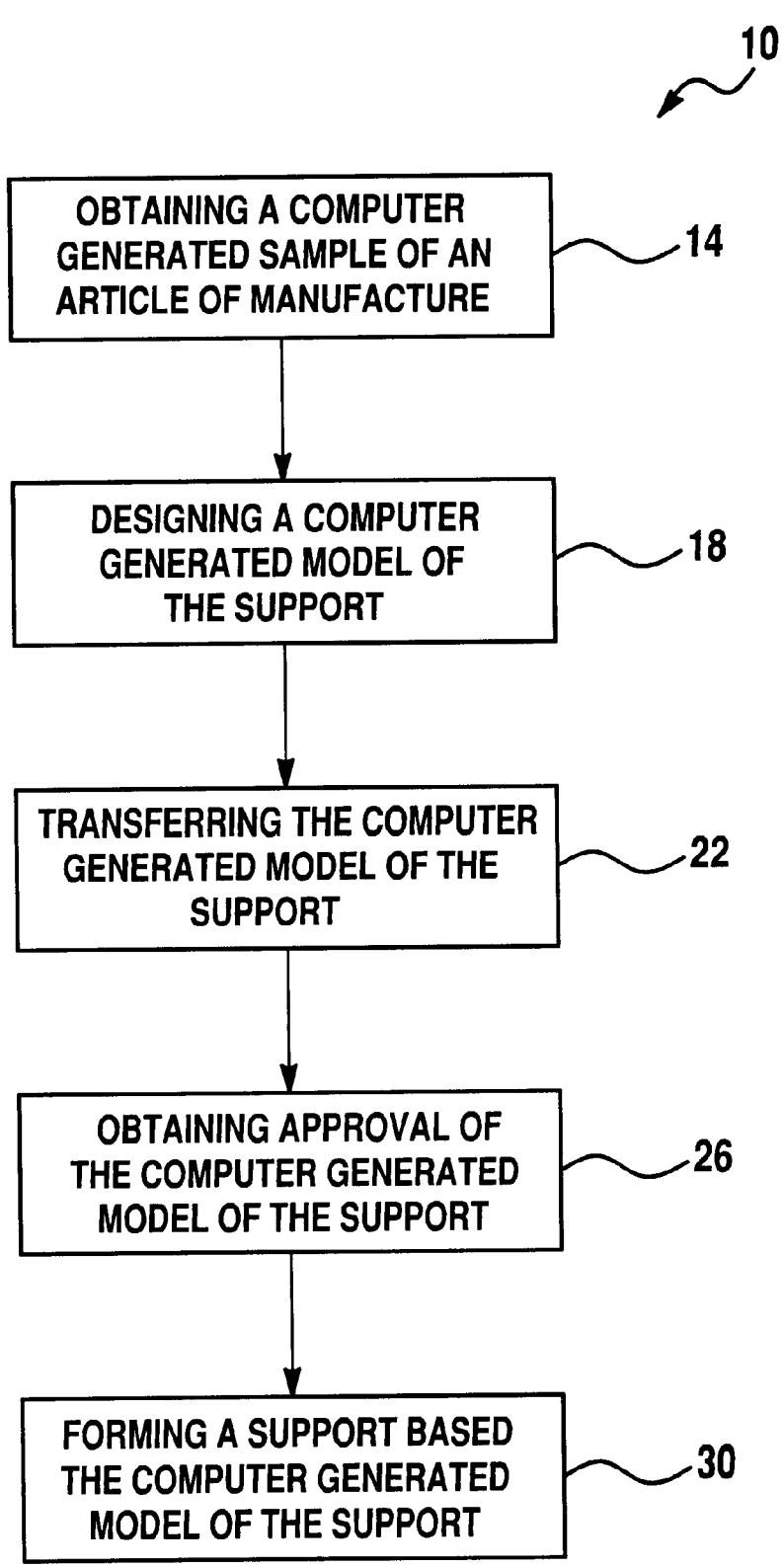
FIG. 1 illustrates a flowchart of a method for producing a support according to a preferred embodiment of the present invention.

Referring now to FIG. 1, there is shown a flowchart of the method 10 according to a preferred embodiment of the present invention. The first step 14 of the method 10 includes obtaining a computer generated sample of an article of manufacture. Preferably, the computer generated sample of the article of manufacture is obtained on a computer which is capable of designing a computer generated model of a support. In a non-limiting embodiment of the invention, the computer generated sample of the article of manufacture is obtained by designing the sample on the computer which is capable of designing the computer generated model of the support. In another non-limiting embodiment of the invention, the computer generated sample of the article of manufacture may be separately obtained and electronically transferred in a conventional manner to the computer which is capable of designing the computer generated model of the support. In the preferred embodiment of the invention, the computer generated sample of the article of manufacture is designed on a conventional and commercially available first software package such as a computer aided design and/or drafting ("CAD") package.

The second step 18 of the method 10 includes designing the computer generated model of the support such that the computer generated model of the support is adapted to selectively receive the computer generated sample of the article. Preferably, the computer generated model of the support is designed with a conventional and commercially available second package of software (e.g., "CAD"software) which is compatible with the first package of software used to design the sample of the article of manufacture. In this manner, the sample of the article and the model of the support may be manipulated by both the first and second software package. Particularly, both the sample of the article and model of the support may be manipulated in a single computer file by a single package of computer software. In one non-limiting embodiment, the first and second software packages are substantially identical. When the first and second software packages are either the same or at least compatible, the computer generated model of the support may be effectively designed to receive one or more of the computer generated samples of the article of manufacture. In fact, the computer generated model of the support may actually be shown in its working state after one or more of the computer generated samples of the articles of manufacture have been received by the model of the support.

In a further non-limiting embodiment of the present invention, a computer simulated person is designed by a third conventional and commercially available software package and is programmed to place the computer generated article on and/or remove the computer generated article from the computer generated support. In the preferred embodiment, the third software package creates and/or records ergonomic data of the simulated person as the simulated person places the computer generated article on and/or removes the computer generated article from the computer generated model of the support. In one non-limiting embodiment, the third software package is different from the first and second, but has the capability of allowing the computer simulated person to manipulate the computer generated sample of the article of manufacture and the computer generated model of the support.

In this manner, the ergonomics of the computer simulated person may be studied with the aid of the third computer package by allowing and/or programming the simulated person to manipulate the model of the support and the sample of the article. By studying the ergonomics, an optimal design for the computer generated model of the support may be produced. An optimal design, in this case, would be a design that minimizes the strain experienced by the computer simulated person as that person places the computer generated sample of the article onto and/or removes the computer generated sample from the computer generated model of the support.

In the preferred embodiment of the present invention, the computer generated sample of the article of manufacture and the computer generated model of the support are both designed by a conventional and commercially available computer aided drafting software package (i.e., the first and/or second software package). Subsequently, the computer generated sample and the computer generated model are transferred to, uploaded in and/or received by a conventional and commercially available third software package which can simulate a person and which can emit and/or produce data regarding the ergonomics of the simulated person. Also in the preferred embodiment, the software package that simulates the person is capable of creating an electronically transferable file (e.g., an AVI file) which shows the simulated person removing the computer generated article from and/or placing the computer generated article upon the computer generated model of the support. The transferable file also has the ability to distribute and/or display relevant data about the model of the support, the sample of the article of manufacture and the ergonomic strain to the simulated person.

The third step 22 of the method 10 includes transferring the computer generated model of the support that was designed in the second step 18 of the method 10. In a non-limiting embodiment of the invention, the computer generated model of the support and the computer generated sample of the article are transferred by known and conventional methods of electronic transfer (e.g., a computer network, the "internet" and/or "e-mail"). Typically, the model of the support and the sample of the article are transferred to a person and/or place where and/or by whom the model and the sample are to be approved or disapproved.

In a particular non-limiting embodiment of the invention, an electronic message (e.g., an "e-mail") is sent to a person whom is authorized to approve or disapprove of the proposed design for the model of the support. The electronic message alerts the authorized person that the model of the support is available over the internet and directs the authorized person (e.g., by hyperlink) to a particular location (e.g., a "URL" address) on the internet. In the preferred embodiment, the e-mail message has a conventional function which automatically sends a second e-mail to the sender of the original e-mail once the original e-mail has been opened. The authorized person then retrieves the model of the support from the particular location, studies, views and/or analyzes the support, and then the authorized person may approve, disapprove and/or comment on the computer generated model of the support.

In the preferred embodiment, the authorized person is directed to a location on the internet that includes the aforementioned file (e.g., the AVI file) of the simulated person who places the computer generated sample of the article of manufacture on and/or removes the computer generated sample from the computer generated model of the support. This allows the authorized person to study, view and/or analyze the computer generated model of the support and/or the ergonomics of the computer simulated person. Again the authorized person has the choice of approving, disapproving and/or commenting upon the design of the computer generated model of the support. Of course, the aforementioned original e-mail may be sent to multiple authorized persons for approval.

Furthermore, in the preferred embodiment, the URL address will have "buttons" on the internet page from which the AVI file is retrieved. The buttons allow the viewer of the AVI file to approve, disapprove and/or comment on the proposed model of the support. An approve and/or disapprove button and/or icon can be place on the internet page along with a space for comments. The viewer of the page can write comments in the space for comments and an automatic e-mail message including approval, disapproval and/or comments on the model for support may be sent by pointing and clicking on one of the buttons with a computer "mouse".

The fourth step 26 of the method 10 includes obtaining approval of the computer generated model that was transferred in third step 22 of the method 10. In one non-limiting embodiment of the invention, the step 26 of obtaining approval is initially passive and includes merely waiting for approval, disapproval and/or comments from the authorized person from whom approval is sought. Upon receipt of approval, disapproval and/or comments from the authorized person, the computer generated model of the support is either altered or remains the same depending upon whether the authorized person has approved the model. If the model of the support is approved and/or commented upon in a way that does not require alteration of the model, then the fifth step 30 of the present method 10 is commenced. However, if the model is disapproved or commented upon in a way that requires alteration of the model, the computer generated model of the support is redesigned or the present computer generated model is altered. If alteration or redesign is required, the computer generated model of the support is redesigned and/or altered using the same software that was used to originally design the support and then retransferred for approval. Thereafter, the computer generated model of the support is redesigned, altered and/or retransferred until approval for the model of the support is obtained so that the fifth step 30 of the invention is ready to be performed.

The fifth step 30 of the method 10 includes forming a support and/or support prototype based on the computer generated model of the support after obtaining approval for the computer generated model as in the fourth step 26. In a non-limiting embodiment of the invention, the support is designed by known and conventional processes which utilize a computer generated model of a support to produce a physical model of the support.

The method 10 has particular advantages for designing and/or forming physical supports for articles of manufacture. By obtaining advanced approval of a computer generated model of such a support, the likelihood that a prototype based upon such a model will be successful is substantially increased. Furthermore, the method 10 quickly and efficiently focuses all interested parties upon the proposed computer generated model of the support such that the support design meets with at least the preliminary approval of all the interested parties prior to ever designing a support and/or support prototype. In this manner, many if not all potential drawbacks or problems for a particular support can be identified and cured prior to creation of a prototype of such a support. Furthermore, since the computer model of the support, the computer sample of the article and the simulated person can closely simulate the respective "real-life" roles of the support, the article and a person manipulating the article and the support, problems with any given support are readily identified prior to actually forming and/or manufacturing a support and/or support prototype.

It should be understood that the invention is not limited to the exact embodiment or construction which has been illustrated and described but that various changes may be made without departing from the spirit and the scope of the invention.

What is claimed is:

1. A method for producing a support for transferring an article of manufacture, said method comprising the steps of:
   obtaining a computer generated sample of said article;
   designing a computer generated model of said support such that said computer generated model of said support will selectively receive said computer generated sample of said article;
   obtaining approval of said computer generated model of said support;
   transferring said computer generated sample and said computer generated model to a third software package which can simulate a person; and
   creating a file that has said simulated person remove said sample from said model while creating ergonomic data on said simulated person.

2. A method as in claim 1 further comprising:
   electronically transferring said computer generated model of said support after designing said computer generated model of said support.

3. A method as in claim 1, wherein said step of obtaining said computer generated sample of said article includes having said sample electronically transferred.

4. A method according to claim 1 wherein said computer generated sample of said article has been formed through the use of a first software package.

5. A method as in claim 4, wherein said computer generated model of said support is formed through the use of a second software package.

6. A method as in claim 5 wherein said first software package is compatible with said second software package.

7. A method as in claim 6 wherein said first and second software packages utilize a computer aided drafting program.

8. A method as in claim 7 wherein the first and second software packages are the same.

9. A method as in claim 1 further comprising the step of transferring said computer generated sample and said computer generated model to a third software package which can simulate a person.

10. A method as in claim 9 further comprising the step of: creating a file that has said simulated person remove said sample from said model while creating ergonomic data on said simulated person.

11. A method as in claim 1 wherein said file is an AVI file.

12. A method as in claim 2 wherein said step of transferring said computer generated model of said support includes electronically transferring said support through the use of a computer network.

13. A method as in claim 2 wherein said step of transferring said computer generated model of said support includes transferring a file containing both said computer generated model of said support and said computer generated sample of said article in a single file, wherein said file allows said model of said support to selectively receive said sample of said article.

14. A method as in claim 1 wherein said step of obtaining approval requires alteration of a disapproved design for said model of said support.

15. A method for forming a support for transferring an article of manufacture, said method comprising the steps of:
   designing an electronic sample of an article of manufacture;
   designing an electronic model of said support;
   forming a computer file having said sample and said model, said sample received by said model; and
   distributing said file for approval of said model;
   wherein said computer file includes a simulated person which removes said sample from said model and wherein said file creates ergonomic data about said simulated person.

16. A method as in claim 15 wherein said sample and said model are designed with a computer aided drafting software package.

17. A method as in claim 15 wherein said computer file includes a simulated person which removes said sample from said model and wherein said file creates ergonomic data about said simulated person.

18. A method as in claim 15 further comprising:
   obtaining approval of said model of said support.

19. A method as in claim 18 wherein said step of obtaining approval requires alteration of said model of said support upon disapproval of said model.

20. A method for producing a support for transferring an article of manufacture, said method comprising the steps of:
   obtaining a computer generated sample of said article which is made using a computer aided drafting software package;
   designing a computer generated model of said support such that said computer generated model of said support will selectively receive said computer generated sample of said article;
   transferring said computer generated model of said support and said computer generated sample of said manufacture to a second software package which has the ability to simulate a person removing said sample from said model and which can create ergonomic data of said simulated person;
   creating a file which shows said person removing said sample from model and which displays said ergonomic data;
   obtaining approval of said computer generated model of said support and said ergonomic data; and
   forming said support based on said model of said support.

* * * * *